United States Patent
Sharma et al.

(10) Patent No.: US 11,056,571 B2
(45) Date of Patent: *Jul. 6, 2021

(54) MEMORY CELLS AND INTEGRATED STRUCTURES

(71) Applicant: Micron Technology, Inc., Boise, ID (US)

(72) Inventors: Ankit Sharma, Boise, ID (US); Akira Goda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/444,532

(22) Filed: Jun. 18, 2019

(65) Prior Publication Data

US 2020/0403080 A1 Dec. 24, 2020

(51) Int. Cl.
*H01L 29/51* (2006.01)
*H01L 27/1157* (2017.01)
*H01L 27/11582* (2017.01)
*H01L 29/66* (2006.01)

(52) U.S. Cl.
CPC ........ *H01L 29/513* (2013.01); *H01L 27/1157* (2013.01); *H01L 27/11582* (2013.01); *H01L 29/66833* (2013.01)

(58) Field of Classification Search
CPC ............. H01L 29/792; H01L 27/11582; H01L 27/1157; H01L 21/28282; H01L 29/66833
See application file for complete search history.

(56) References Cited

U.S. PATENT DOCUMENTS

| | | | |
|---|---|---|---|
| 9,978,772 B1* | 5/2018 | Carlson | G11C 16/0466 |
| 10,446,574 B2* | 10/2019 | Carlson | G11C 16/0483 |
| 2007/0235793 A1* | 10/2007 | Yamazaki | H01L 27/1214 257/314 |
| 2009/0014781 A1* | 1/2009 | Baik | H01L 29/40117 257/324 |
| 2009/0035904 A1* | 2/2009 | Bhattacharyya | H01L 29/7881 438/261 |
| 2009/0140317 A1* | 6/2009 | Rosmeulen | H01L 29/40114 257/316 |
| 2010/0062595 A1* | 3/2010 | Lim | H01L 29/40114 438/591 |

(Continued)

OTHER PUBLICATIONS

Baek et al., "Characterization of Novel SiO2/a-Si/a-Siox Tunnel Barrier Engineered Oxide", IEEE, 2010, United States, 4 pages.

(Continued)

*Primary Examiner* — Nicholas J Tobergte
(74) *Attorney, Agent, or Firm* — Wells St. John P.S.

(57) ABSTRACT

A memory cell comprises, in the following order, channel material, a charge-passage structure, programmable material, a charge-blocking region, and a control gate. The charge-passage structure comprises a first material closest to the channel material, a third material furthest from the channel material, and a second material between the first material and the third material. The first and third materials comprise $SiO_2$. The second material has a thickness of 0.4 nanometer to 5.0 nanometers and comprises $SiO_x$, where "x" is less than 2.0 and greater than 0. Other embodiments are disclosed.

45 Claims, 5 Drawing Sheets

(56) References Cited

U.S. PATENT DOCUMENTS

| | | | | |
|---|---|---|---|---|
| 2011/0127580 A1* | 6/2011 | Park | ............... | H01L 29/7841 |
| | | | | 257/192 |
| 2013/0009220 A1* | 1/2013 | Yamazaki | ........... | H01L 29/7869 |
| | | | | 257/288 |
| 2016/0118398 A1* | 4/2016 | Yon | ................ | H01L 29/511 |
| | | | | 257/314 |
| 2016/0126248 A1* | 5/2016 | Rabkin | ............ | H01L 27/1157 |
| | | | | 257/321 |
| 2018/0269227 A1* | 9/2018 | Carlson | ............ | G11C 16/0483 |

OTHER PUBLICATIONS

Tomozeiu, "Silicon Oxide (SiOx, 0<x<2): a Challenging Material of Optoelectronics", Optoelectronics—Materials and Techniques Chapter 3, InTech Europe, 2011, 46 pages.

U.S. Appl. No. 16/432,250, filed Jun. 5, 2019, by Sharma et al.

Zhao et al., "Review on Non-Volitale Memory with High-k Diaelectrics: Flash for Generation Beyon 32 nm", Materials, 2014, Switzerland, pp. 5117-5145.

\* cited by examiner

MEMORY CELLS AND INTEGRATED STRUCTURES

TECHNICAL FIELD

Embodiments disclosed herein pertain to memory cells and to integrated structures, for example those that incorporate memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

DETAILED DESCRIPTION OF EXAMPLE EMBODIMENTS

Operation of NAND memory cells may comprise movement of charge between a channel material and a programmable material (e.g., charge-storage material), with movement of "charge" corresponding to movement of charge carriers (e.g., electrons and holes). For instance, programming of a NAND memory cell may comprise moving charge (e.g., electrons) from the channel material into charge-storage material, and then storing the charge within the charge-storage material. Erasing of the NAND memory cell may comprise moving holes into the charge-storage material to recombine with electrons stored in the charge-storage material, and thereby release charge from the charge-storage material. Charge-storage material may comprise charge-trapping material (for instance, silicon nitride, metal dots, etc.) which reversibly traps charge carriers. It is desired that the charge-trapping material have appropriate charge-trapping probability and/or charge-trapping rate in order that charge carriers are effectively trapped and retained within the charge-trapping material. Charge-trapping probability and charge-trapping rate of a charge-trapping material may be related to the volumetric density of charge traps within charge-trapping material, the energy of the charge traps (i.e., the depths of the charge traps in energy wells), etc.

Channel material may be separated from charge-storage material by insulator/insulating/insulative (i.e., electrical herein) material, and such insulator material may be characterized by an effective oxide thickness (EOT). It can be desired that the insulator material have sufficient EOT to preclude undesired back-migration (i.e., leakage) of charges from the charge-storage material to the channel material. However, increasing EOT can increase the difficulty of removing trapped charges from materials having relatively deep charge traps. It is therefore desired to engineer insulator materials suitable for spacing charge-storage material from channel material to achieve desired EOT for precluding undesired leakage, while also permitting deeply-trapped charges to be removed during an ERASE operation. Further, it is also generally desired that such insulator material not parasitically trap charge carriers therein, or that such parasitic trapping be minimized. Some embodiments include improved NAND memory cells which incorporate charge-passage structures within or as the insulator material between charge-storage structures and channel material. Example embodiments are described with reference to FIGS. 1-6.

Figure 1:
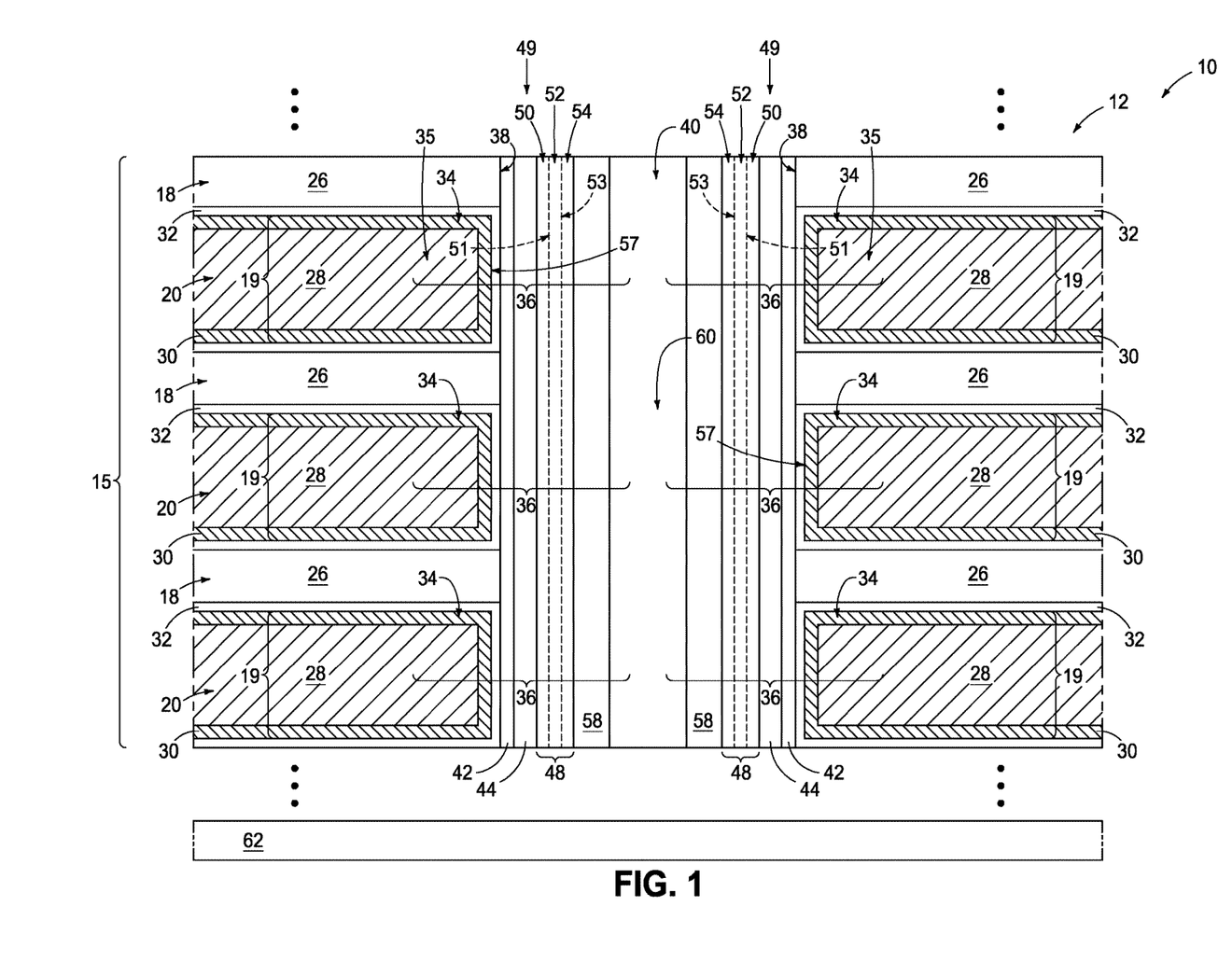
FIG. 1 is a diagrammatic cross-sectional side view of an example integrated structure having a region of an example NAND memory array.

Referring to FIG. 1, a portion of an integrated structure 10 is illustrated, with such portion being a fragment of a 3-dimensional (3D) NAND memory array 12. Integrated structure 10 comprises a vertical stack 15 comprising vertically-alternating levels 18 and 20. Example levels 20 comprise conductor/conducting/conductive (i.e., electrical herein) material 19 and example levels 18 comprise insulator material 26. An example insulator material 26 is doped or undoped silicon dioxide. In one embodiment and as shown, conductive material 19 comprises conductive materials 28 and 30. In one embodiment, conductive material 28 may be considered to be a conductive core, and conductive material 30 may be considered to be an outer conductive layer surrounding the conductive core. Conductive materials 28 and 30 may comprise different compositions relative one another. Examples for each include elemental metals (e.g., tungsten, titanium, copper, etc.), conductive metal compounds (e.g., metal nitrides, metal silicides, metal carbides, etc.), and conductively-doped-semiconductive materials (e.g., silicon, gallium, etc.), including mixtures thereof. In one embodiment, an insulator material 32 forms an insulative liner surrounding outer conductive material layer 30, and may comprise high-k material (e.g., aluminum oxide), where "high-k" means a dielectric constant greater than that of silicon dioxide. Alternately, and by way of examples only, insulator material 32 may be eliminated and/or conductive material 19 may be homogenous. Levels 18 and 20 may be of any suitable vertical thicknesses. In some embodiments, levels 18 and levels 20 may have respective vertical thicknesses of about 10 nanometers (nm) to 300 nm. In some embodiments, levels 18 and 20 have the same vertical thickness and in other embodiments have different vertical thicknesses.

In the example embodiment, insulator materials 26 and 32 together form sidewalls 38 which in one embodiment are vertical. Sidewalls 38 may be considered to be sidewalls of an opening 40 extending through stack 15. Opening 40 may have a continuous shape when viewed from above or in horizontal cross-section, and may be, for example, circular, elliptical, etc. Accordingly, sidewalls 38 of FIG. 1 may be comprised by a continuous sidewall that extends around the periphery of opening 40.

In some embodiments, levels 20 may be wordline levels of a NAND memory array. Example terminal ends 34 of wordline levels 20 may function as control-gate regions 35 of NAND memory cells 36, with approximate locations of memory cells 36 being indicated with brackets in FIG. 1. As shown, memory cells 36 are vertically stacked and form an elevationally-extending (e.g., vertical) string 49 of memory cells 36 (e.g., a NAND string), with the number of memory cells in each string being determined at least in part by the number of levels 20. The stack may comprise any suitable number of conductive-material-containing levels 20. For instance, the stack may have 8 such levels, 16 such levels, 32 such levels, 64 such levels, 512 such levels, 1028 such levels, etc. Additionally, memory cells 36 may be constructed to effectively be completely encircling relative to individual openings 40 such that each opening 40 has one and only one elevationally-extending string 49 (e.g., individual string 49 in horizontal cross-section being a continuous-completely-encircling-annular ring). Alternately, memory cells 36 may be constructed to effectively not be completely encircling relative to individual openings 40 such that each opening 40 may have two or more elevationally-extending strings 49 (e.g., multiple memory cells 36 with multiple wordlines per level 20).

Channel material 58 extends elevationally along vertical stack 15 within opening 40. Such may comprise any suitable material, for example comprising, consisting essentially of, or consisting of appropriately-doped silicon. Channel material 58 as shown comprises an elevationally-extending cylinder, for example as a commonly termed hollow-channel configuration. A radially internal volume of channel material 58 may comprise a void space (not shown) or may comprise insulator material 60 extending along a middle of opening 40 radially within channel material 58. Insulator material 60 may comprise, for example, silicon dioxide, silicon nitride, etc. In another example embodiment, channel material 58 may entirely fill (not shown) the central region of opening 40 to form an elevationally-extending pedestal of channel material within such central region.

A charge-passage structure 48 is laterally (e.g., radially) outward of channel material 58 and extends elevationally there-along. Charge-passage structure 48 comprises a first material 54 closest to channel material 58 and a third material 50 furthest from channel material 58. A second material 52 is between first material 54 and third material 50. In one embodiment, first material 54 is directly against second material 52. In one embodiment, second material 52 is directly against third material 50. A dashed line 51 is provided to diagrammatically illustrate an approximate boundary between first material 54 and second material 52, and a dashed line 53 is provided to diagrammatically illustrate an approximate boundary between second material 52 and third material 50. In some embodiments, one or both of first material 54 and third material 50 are not directly against (not shown) second material 52. In the shown embodiment, materials 50, 52, and 54 are of the same horizontal width/thickness as one another. In other embodiments, one or more of materials 50, 52, and 54 may be of a different horizontal thickness (not shown) as compared to others of materials 50, 52, and 54. Additional attributes of materials 54, 52, and 50 of charge-passage structure 48 are described below.

Programmable material 44 (e.g., charge-storage material) is laterally (e.g., radially) outward of charge-passage structure 48 and within levels 20 comprising conductive material 19. Programmable material 44 may comprise any suitable composition(s), and in some embodiments may comprise floating gate material (for instance, doped or undoped silicon) or charge-trapping material (for instance, silicon nitride, metal dots, etc.). In some embodiments, programmable material 44 may comprise, consist essentially of, or consist of silicon nitride. In some embodiments, programmable material 44 may consist of silicon nitride, and may have a thickness of 15 nm to 500 nm. In one embodiment and as shown, programmable material 44 extends elevationally along charge-passage structure 48, in one embodiment is directly against charge-passage structure 48, and in one embodiment is directly against third material 50 thereof.

A charge-blocking region is within levels 20. Such a region is laterally (e.g., radially) outward of charge-passage structure 48 and laterally (e.g., radially) inward of conductive material 19. An example charge-blocking region as shown comprises an insulator material 42 (e.g., in combination with insulator material 32 when present). Insulator material 42 may comprise any suitable composition(s), for example one or more oxides such as silicon dioxide, etc., and may be of any suitable thickness (e.g., 100 nm to 300 nm). By way of further examples, a charge-blocking region may comprise a laterally (e.g., radially) outer portion of the programmable material (e.g., material 44) where such programmable material is insulative (e.g., in the absence of any different-composition material between insulative-programmable material 44 and conductive material 19). Regardless, as an additional example, an interface of a programmable material and conductive material of a control gate may be sufficient to function as a charge-blocking region in the absence of any separate-composition-insulator material 32/42. Further, an interface 57 of conductive material 19 with material 32/42 (when present) in combination with insulator material 32/42 may together function as a charge-blocking region, and as alternately or additionally may a laterally-outer region of an insulative-programmable material (e.g., a silicon nitride material 44). A charge block may have the following functions in a memory cell: In a program mode, the charge block may prevent charge carriers from passing out of the programmable material (e.g., floating-gate material, charge-trapping material, etc.) toward the control gate, and in an erase mode the charge block may prevent charge carriers from flowing into the programmable material from the control gate. Accordingly, a charge block may function to block charge migration between the control-gate region and the programmable material of individual memory cells.

Stack 15 in the example embodiment is supported by a base 62. A break is shown between base 62 and stack 15 to indicate that there may be additional materials and/or integrated circuit structure between base 62 and stack 15. In some applications, such additional integrated materials may include, for example, source-side select gate material (SGS material). Base 62 may comprise semiconductor material, for example, comprising, consisting essentially of, or consisting of monocrystalline silicon. Base 62 may be referred to as a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In some applications, base 62 may correspond to a semiconductor substrate containing one or more materials associated with integrated circuit fabrication. Such materials may include, for example, one or more of refractory-metal materials, barrier materials, diffusion materials, insulator materials, etc.

In one embodiment, first material 54 of charge-passage structure 48 is directly against channel material 58. In one embodiment, third material 50 of charge-passage structure 48 is directly against programmable material 44. Regardless, in a first embodiment, second material 52 has a thickness of 0.4 nanometer to 5.0 nanometers, in one embodiment from 0.9 nanometer to 1.1 nanometers, and comprises $SiO_x$, where "x" is less than 2.0 and greater than 0. In one embodiment, "x" is no greater than 1.5, and in one such embodiment is less than 1.5 and in one such embodiment is less than 1.0. In one embodiment and as shown, the thickness of second material 52 is constant. In another embodiment, such thickness is variable (not shown), and has a minimum value that is no less than 1.0 nanometer. In one embodiment and as shown, first material 54 is directly against second material 52 and second material 52 is directly against third material 50. In one embodiment, first material 54 and third material 50 consist of or consists essentially of $SiO_2$ and second material 52 consists of or consists essentially of the $SiO_x$. In one embodiment, second material 52 is devoid of silicon nitride. In the context of this document, "devoid" of a stated material includes from 0 to no more than 0.001 molar percent in the stated material. Any other attribute(s) or aspect(s) as shown and/or described herein with respect to other embodiments may be used.

In a second embodiment, first material 54 comprises $SiO_x$ where "x" is no greater than 2.0, in one embodiment is 2.0 and in another embodiment is less than 2.0. Second material 52 has a thickness of 0.4 nanometer to 5.0 nanometers, in one embodiment from 0.4 to 0.7 nanometer, and comprises elemental-form silicon. In one embodiment, first material 54 consists of or consists essentially of the $SiO_x$ and third material 50 consists of or consists essentially of $SiO_2$. In one such embodiment, first material 54 is directly against second material 52 and second material 52 is directly against third material 50. In one such latter embodiment, first material 54 is directly against channel material 58 and third material 50 is directly against programmable material 44. Any other attribute(s) or aspect(s) as shown and/or described herein with respect to other embodiments may be used.

Charge-passage structure 48 can function as a material through which charge carriers tunnel (e.g., Fowler-Nordheim tunneling, Frenkel-Poole tunneling, direct tunneling, trap-assisted tunneling, etc.) or otherwise pass during programming operations, erasing operations, etc. Charge-passage structure 48 is ideally engineered as described to have appropriate properties to provide sufficient EOT to preclude undesired back-migration (i.e., leakage) of charge carriers from programmable material 44 to channel material 58 while also permitting charge carriers within programmable material 44 to be removed from material 44 (i.e., transferred from programmable material 44 to channel material 58) during an ERASE operation.

Figure 2:
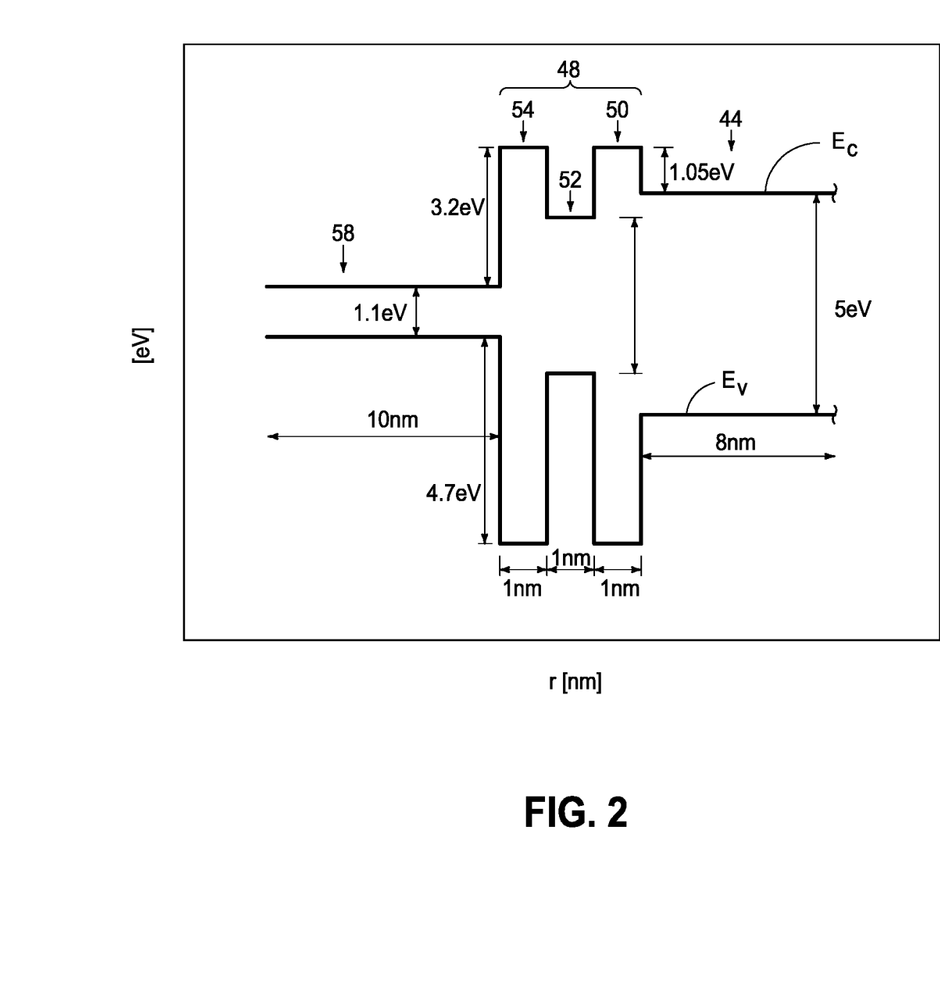
FIG. 2 is a band diagram illustrating example characteristics for an integrated structure analogous to that of FIG. 1.

Example embodiments are further described with reference to FIGS. 2-4. Referring to FIG. 2, a diagrammatic band diagram is shown for a construction like that of FIG. 1 for the first-embodiment (e.g., second material 52 having a thickness of 1.0 nanometer to 2.5 nanometers and comprising $SiO_x$, where "x" is less than 2.0 and at least 1.0). Such shows valence ($E_v$) and conduction ($E_c$) bands in volts (y-axis) as a function of radius (in nanometers) of materials 58, 54, 52, 50, and 44 from the radially-innermost edge of channel material 58 within opening 40 in FIG. 1. FIG. 2 shows a static or resting state wherein no voltage differential exists between or across any two of materials 58, 54, 52, 50, and 44. When a programming or erasing action is applied, the FIG. 2—depicted horizontal lines at least for regions 54, 52, 50, and 44 would likely not be horizontal. For example, for an erasing action where a sufficient negative voltage differential is provided between channel material 58 and control-gate material 19, the horizontal lines may slope upwardly from left-to-right (not shown) with lines $E_c$ and $E_v$ remaining parallel relative one another. Holes would tunnel from left-to-right from channel material 58 within a regime that may enable such tunneling holes to cross charge-passage structure 48 without being impeded by second material 52 and third material 50. The holes may ease removal of electrons from programmable material 44. Charge carriers (e.g., electrons) in programmable material 44 may essentially combine with the holes, thus essentially deleting charge from programmable material 44 to erase from a high or highest threshold voltage ($V_t$) memory state to low or lowest $V_t$ memory state. A desired voltage differential may be achieved by application of suitable voltage to conductive material 19, with no or ground voltage being provided to channel material 58. For programming a memory cell 36 to a high $V_t$ state for the same but positive voltage differential between the channel and control-gate materials whereby charge carriers (e.g., electrons) within channel region 58 would tunnel left-to-right to be trapped in programmable material 44, an analogous band diagram (not shown) would have the valence and conduction band lines on average sloping downwardly from left-to-right.

Figure 3:
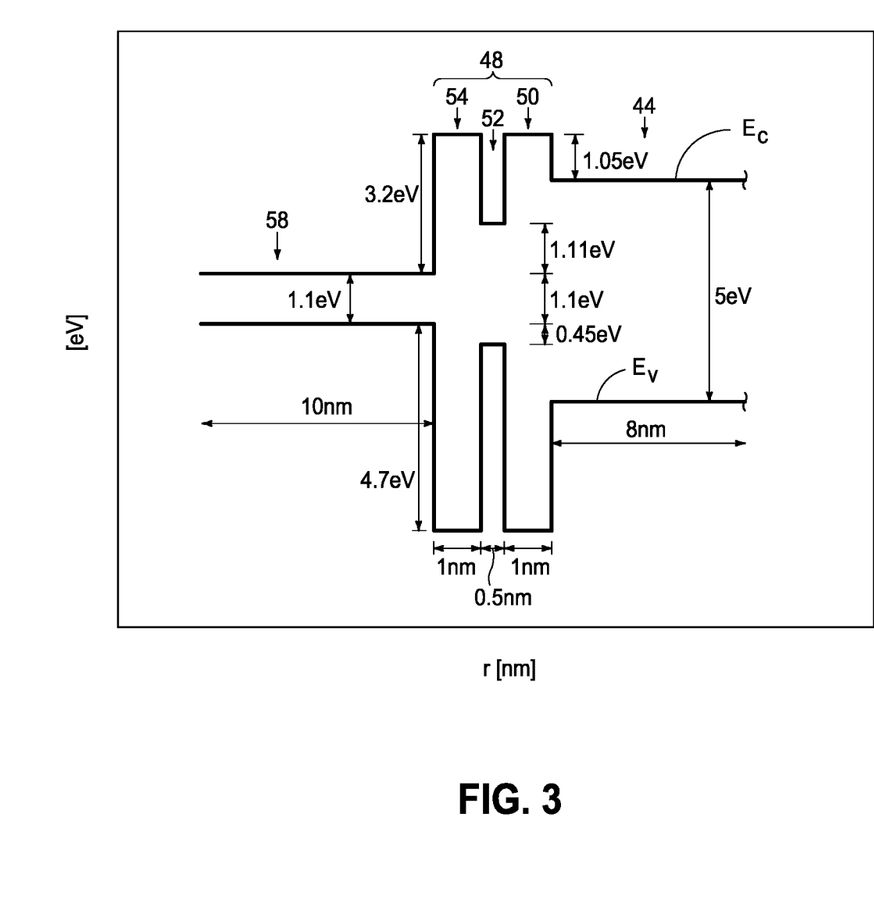
FIG. 3 is a band diagram illustrating example characteristics for another integrated structure analogous to that of FIG. 1.
Figure 4:
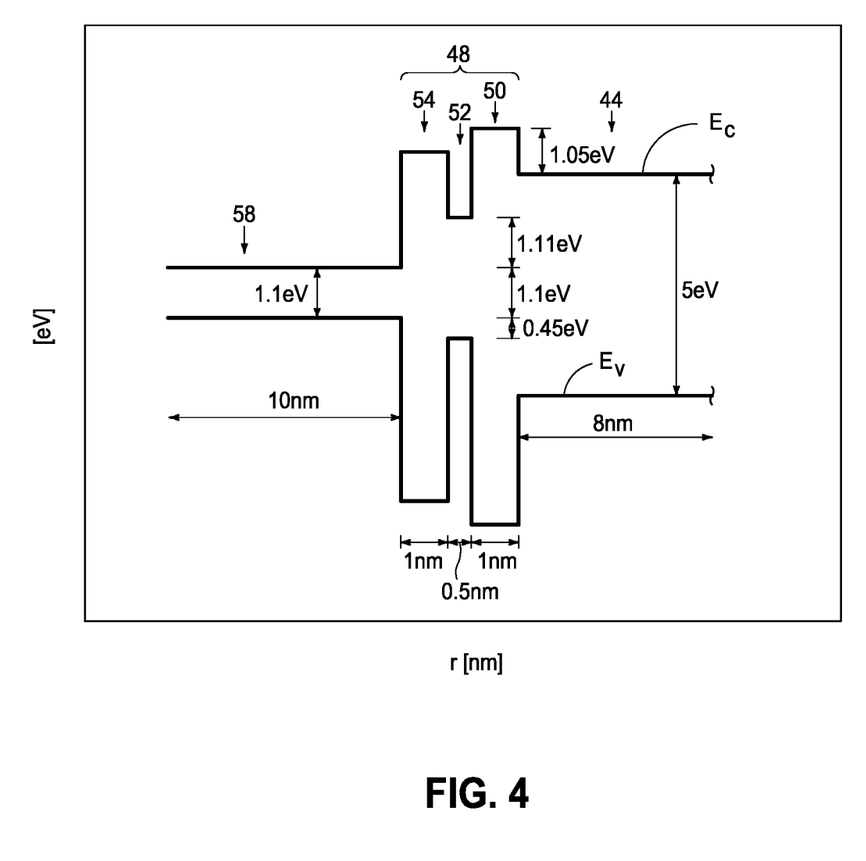
FIG. 4 is a band diagram illustrating example characteristics for yet another integrated structure analogous to that of FIG. 1.

FIG. 3 shows an alternate example diagrammatic band diagram for a construction like that of FIG. 1 for the second embodiment (e.g., second material 52 having a thickness of 0.4 nanometer to 5.0 nanometers and comprising elemental-form silicon) and with first material 54 being $SiO_2$. FIG. 4 shows an alternate example diagrammatic band diagram like FIG. 3 for the second embodiment, but where first material 54 is $SiO_x$, where "x" is less than 2.0. FIGS. 3 and 4, like FIG. 2, show a respective static or resting state wherein no voltage differential exists between or across any two of materials 58, 54, 52, 50, and 44.

In one embodiment, in charge-passage structure 48, first material 54 comprises $SiO_{x1}N_{y1}$, second material 52 comprises $SiO_{x2}N_{y2}$, third material 50 comprises $SiO_{x3}N_{y3}$; x1, x2, x3, y1, y2, y3 are each greater than 0; x1 is less than 2, y1 is less than 1; and x3<x2<x1 and y3>y2>y1. In one embodiment, each of the first, second, and third materials has a thickness no greater than 50 Angstroms. In one embodiment, the first material is directly against the channel material, the second material is directly against the first material, and the third material is directly against the second material. In one embodiment, the first material consists of or consists essentially of the $SiO_{x1}N_{y1}$; the second material consists of or consists essentially of the $SiO_{x2}N_{y2}$; and the third material consists of or consists essentially of the $SiO_{x3}N_{y3}$. In one embodiment, x1 is greater than or equal to 1, and in one embodiment y1 is less than or equal to 0.5. Integrated structures may comprise the above charge-passage structure. Further, any other attribute(s) or aspect(s) as shown and/or described herein with respect to other embodiments may be used. Such a charge-passage structure may exhibit better/greater retention of stored charge and improved erase performance than predecessor structures.

Figure 5:
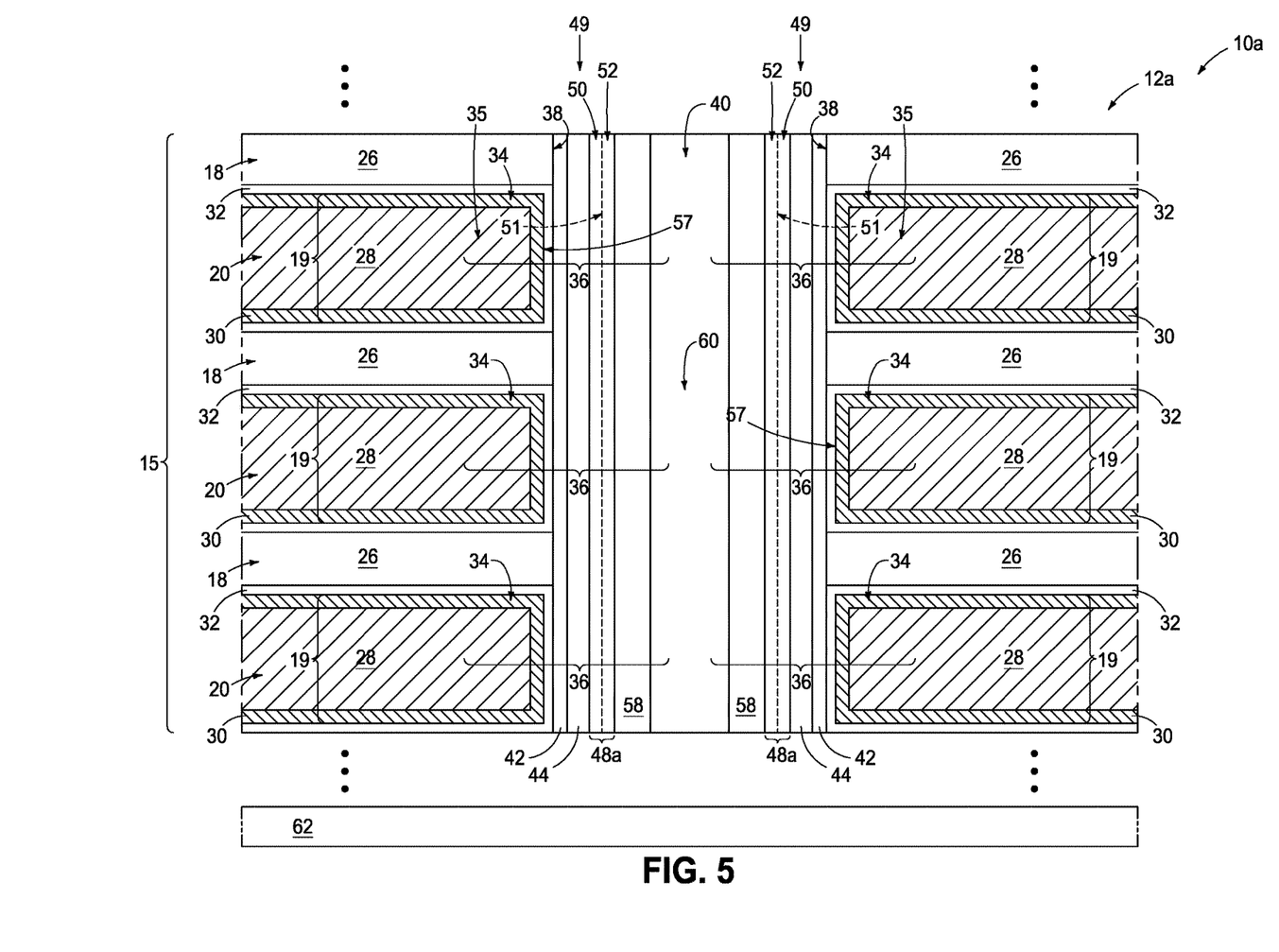
FIG. 5 is a diagrammatic cross-sectional side view of an example integrated structure having a region of an example NAND memory array.

Alternate example embodiments are next described with reference to FIG. 5. Like numerals from the above-described embodiment have been used where appropriate, with some construction differences being indicated with the suffix "a". Construction 10a comprises an array 12a having a charge-passage structure 48a. In one embodiment, charge-passage structure 48a comprises a first material 52 closest to and directly against channel material 58 and a second material 50 furthest from and directly against first material 52. The first material has a thickness of 0.4 nanometer to 5.0 nanometers and comprises $SiO_x$, where "x" is less than 2.0 and greater than 0. The second material comprises $SiO_2$. In another embodiment, charge-passage structure 48a comprises a first material 52 closest to and directly against channel material 58 and a second material 50 furthest from and directly against first material 52. The first material has a thickness of 0.4 nanometer to 5.0 nanometers and comprises elemental-form silicon. The second material comprises $SiO_2$. Integrated structures may comprise either of the above charge-passage structures. Further, any other attribute(s) or aspect(s) as shown and/or described herein with respect to other embodiments may be used.

Memory cells in accordance with the above-described embodiments may provide greater erase and programming reliability while minimizing parasitic charge trapping within charge-passage structure 48/48a (and particularly in a middle/second/first material 52) in comparison to prior art stoichiometric silicon dioxide/stoichiometric silicon nitride/stoichiometric silicon dioxide charge-passage structures. Alternately, memory cells in accordance with the above-described embodiments may provide equivalent erase and programming reliability as prior art stoichiometric silicon dioxide/stoichiometric silicon nitride/stoichiometric silicon dioxide charge-passage structures but wherein the middle/second material may be thinner than prior art stoichiometric silicon nitride layers in such structures.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory cell comprises, in the following order, channel material, a charge-passage structure, programmable material, a charge-blocking region, and a control gate. The charge-passage structure comprises a first material closest to the channel material, a third material furthest from the channel material, and a second material between the first material and the third material. The first and third materials comprise $SiO_2$. The second material has a thickness of 0.4 nanometer to 5.0 nanometers and comprises $SiO_x$, where "x" is less than 2.0 and greater than 1.0.

In some embodiments, an integrated structure comprises a vertical stack comprising vertically-alternating levels of conductive material and insulator material. Channel material extends elevationally along the vertical stack. A charge-passage structure is laterally outward of and extends elevationally along the channel material. The charge-passage structure comprises a first material closest to the channel material, a third material furthest from the channel material, and a second material between the first material and the third material. The first and third materials comprise $SiO_2$. The second material has a thickness of 0.4 nanometer to 5.0 nanometers and comprises $SiO_x$, where "x" is less than 2.0 and greater than 0. Programmable material is laterally outward of the charge-passage structure and within the levels comprises conductive material. A charge-blocking region is within the levels and comprises conductive material. The charge-blocking region is laterally outward of the charge-passage structure and laterally inward of the conductive material.

In some embodiments, a memory cell comprises, in the following order, channel material, a charge-passage structure, programmable material, a charge-blocking region, and a control gate. The charge-passage structure comprises a first material closest to the channel material, a third material furthest from the channel material, and a second material between the first material and the third material. The first material comprises $SiO_x$, where "x" is no greater than 2.0, and the third material comprises $SiO_2$. The second material has a thickness of 0.4 nanometer to 5.0 nanometers and comprises elemental-form silicon.

In some embodiments, an integrated structure comprises a vertical stack comprising vertically-alternating levels of conductive material and insulator material. Channel material extends elevationally along the vertical stack. A charge-passage structure is laterally outward of and extends elevationally along the channel material. The charge-passage structure comprises a first material closest to the channel material, a third material furthest from the channel material, and a second material between the first material and the third material. The first material comprises $SiO_x$, where "x" is no greater than 2.0, and the third material comprises $SiO_2$. The second material has a thickness of 0.4 nanometer 5.0 nanometers and comprises elemental-form silicon. Programmable material is laterally outward of the charge-passage structure and within the levels comprises conductive material. A charge-blocking region within the levels comprises conductive material. The charge-blocking region is laterally outward of the charge-passage structure and laterally inward of the conductive material.

In some embodiments, a memory cell comprises, in the following order, channel material, a charge-passage structure, programmable material, a charge-blocking region, and a control gate. The charge-passage structure comprises a first material closest to and directly against the channel material and a second material furthest from and directly against the first material. The first material has a thickness of 0.4 nanometer to 5.0 nanometers and comprises $SiO_x$, where "x" is less than 2.0 and greater than 0, and the second material comprises $SiO_2$.

In some embodiments, a memory cell comprises, in the following order, channel material, a charge-passage structure, programmable material, a charge-blocking region, and a control gate. The charge-passage structure comprises a first material closest to and directly against the channel material and a second material furthest from and directly against the first material. The first material has a thickness of 0.4 nanometer to 5.0 nanometers and comprises elemental-form silicon, and the second material comprises $SiO_2$.

In some embodiments, a memory cell comprises, in the following order, channel material, a charge-passage structure, programmable material, a charge-blocking region, and a control gate. The charge-passage structure comprises a first material closest to the channel material, a third material furthest from the channel material, and a second material between the first material and the third material. The first material comprises $SiO_{x1}N_{y1}$. The second material comprises $SiO_{x2}N_{y2}$. The third material comprises $SiO_{x3}N_{y3}$. Each of x1, x2, x3, y1, y2, y3 is greater than 0; x1 is less than 2; y1 is less than 1; x3<x2<x1 and y3>y2>y1.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising, in the following order:
   channel material;
   a charge-passage structure;
   programmable material;
   a charge-blocking region;
   a control gate; and
   the charge-passage structure comprising:
      a first material closest to the channel material, a third material furthest from the channel material, and a second material between the first material and the third material;
      the first and third materials comprising $SiO_2$; and
      the second material having a thickness of 0.4 nanometer to 5.0 nanometers and comprising $SiO_x$, where "x" is less than 2.0 and greater than 0.

2. The memory cell of claim 1 wherein the second material consists of or consists essentially of the $SiO_x$.

3. The memory cell of claim 1 wherein "x" is no greater than 1.5.

4. The memory cell of claim 3 wherein "x" is less than 1.5.

5. The memory cell of claim 4 wherein "x" is less than 1.0.

6. The memory cell of claim 1 wherein the thickness is 0.9 nanometer to 1.1 nanometers.

7. The memory cell of claim 1 wherein the thickness is constant.

8. The memory cell of claim 1 wherein the thickness is variable, a minimum value of the thickness being no less than 1.0 nanometer.

9. The memory cell of claim 1 wherein the first material and third materials consist of or consist essentially of $SiO_2$ and the second material consists of or consists essentially of the $SiO_x$.

10. The memory cell of claim 1 wherein the second material is devoid of silicon nitride.

11. The memory cell of claim 1 wherein the first material is directly against the second material and the second material is directly against the third material.

12. The memory cell of claim 11 wherein the first material is directly against the channel material and the third material is directly against the programmable material.

13. The memory cell of claim 11 wherein the first material and third materials consist of or consist essentially of $SiO_2$ and the second material consists of or consists essentially of the $SiO_x$.

14. An integrated structure, comprising:
   a vertical stack comprising vertically-alternating levels of conductive material and insulator material;
   channel material extending elevationally along the vertical stack;
   a charge-passage structure laterally outward of and extending elevationally along the channel material, the charge-passage structure comprising:
      a first material closest to the channel material, a third material furthest from the channel material, and a second material between the first material and the third material;
      the first and third materials comprising $SiO_2$; and
      the second material having a thickness of 0.4 nanometer to 5.0 nanometers and comprising $SiO_x$, where "x" is less than 2.0 and greater than 0;
   programmable material laterally outward of the charge-passage structure and within the levels comprising conductive material; and
   a charge-blocking region within the levels comprising conductive material, the charge-blocking region being laterally outward of the charge-passage structure and laterally inward of the conductive material.

15. The integrated structure of claim 14 comprising a NAND memory array wherein the levels of conductive material comprise wordline levels.

16. A memory cell, comprising, in the following order:
   channel material;
   a charge-passage structure;
   programmable material;
   a charge-blocking region;
   a control gate; and
   the charge-passage structure comprising:
      a first material closest to the channel material, a third material furthest from the channel material, and a second material between the first material and the third material;
      the first material comprising $SiO_x$ where "x" is no greater than 2.0;
      the third material comprising $SiO_2$; and
      the second material having a thickness of 0.4 nanometer to 5.0 nanometers and comprising elemental-form silicon.

17. An integrated structure, comprising:
   a vertical stack comprising vertically-alternating levels of conductive material and insulator material;
   channel material extending elevationally along the vertical stack;
   a charge-passage structure laterally outward of and extending elevationally along the channel material, the charge-passage structure comprising:
      a first material closest to the channel material, a third material furthest from the channel material, and a second material between the first material and the third material;
      the first material comprising $SiO_x$ where "x" is no greater than 2.0;
      the third material comprising $SiO_2$; and
      the second material having a thickness of 0.4 nanometer to 5.0 nanometers and comprising elemental-form silicon;

programmable material laterally outward of the charge-passage structure and within the levels comprising conductive material; and
a charge-blocking region within the levels comprising conductive material, the charge-blocking region being laterally outward of the charge-passage structure and laterally inward of the conductive material.

18. A memory cell, comprising, in the following order:
channel material;
a charge-passage structure;
programmable material;
a charge-blocking region;
a control gate; and
the charge-passage structure comprising:
   a first material closest to and directly against the channel material and a second material furthest from and directly against the first material;
   the first material having a thickness of 0.4 nanometer to 5.0 nanometers and comprising $SiO_x$, where "x" is less than 2.0 and greater than 0; and
   the second material comprises $SiO_2$.

19. A memory cell, comprising, in the following order:
channel material;
a charge-passage structure;
programmable material;
a charge-blocking region;
a control gate; and
the charge-passage structure comprising:
   a first material closest to and directly against the channel material and a second material furthest from and directly against the first material;
   the first material having a thickness of 0.4 nanometer to 5.0 nanometers and comprising elemental-form silicon; and
   the second material comprises $SiO_2$.

20. A memory cell, comprising, in the following order:
channel material;
a charge-passage structure;
programmable material;
a charge-blocking region;
a control gate; and
the charge-passage structure comprising:
   a first material closest to the channel material, a third material furthest from the channel material, and a second material between the first material and the third material;
   the first material comprises $SiO_{x1}N_{y1}$;
   the second material comprises $SiO_{x2}N_{y2}$;
   the third material comprises $SiO_{x3}N_{y3}$;
   x1, x2, x3, y1, y2, y3 are each greater than 0;
   x1 is less than 2;
   y1 is less than 1; and
   x3<x2<x1 and y3>y2>y1.

21. The memory cell of claim 16 wherein the second material consists of or consists essentially of the elemental-form silicon.

22. The memory cell of claim 16 wherein the thickness is 0.4 to 0.7 nanometer.

23. The memory cell of claim 16 wherein "x" is 2.0.

24. The memory cell of claim 16 wherein "x" is less than 2.0.

25. The memory cell of claim 16 wherein the second material is devoid of silicon nitride.

26. The memory cell of claim 1 wherein the first material consists of or consists essentially of the $SiO_x$, the third material consists of or consists essentially of $SiO_2$, and the second material consists of or consists essentially of the $SiO_y$.

27. The memory cell of claim 26 wherein the first material is directly against the second material and the second material is directly against the third material.

28. The memory cell of claim 27 wherein the first material is directly against the channel material and the third material is directly against the programmable material.

29. The memory cell of claim 20 wherein each of the first, second, and third materials has a thickness no greater than 50 Angstroms.

30. The memory cell of claim 20 wherein the first material is directly against the channel material, the second material is directly against the first material, and the third material is directly against the second material.

31. The memory cell of claim 20 wherein the first material consists of or consists essentially of the $SiO_{x1}N_{y1}$; the second material consists of or consists essentially of the $SiO_{x2}N_{y2}$; and the third material consists of or consists essentially of the $SiO_{x3}N_{y3}$.

32. The memory cell of claim 20 wherein,
   x1 is greater than or equal to 1; and
   y1 is less than or equal to 0.5.

33. The memory cell of claim 16 wherein the second material consists of or consists essentially of the elemental-form silicon.

34. The memory cell of claim 16 wherein the thickness is 0.4 to 0.7 nanometer.

35. The memory cell of claim 16 wherein "x" is 2.0.

36. The memory cell of claim 16 wherein "x" is less than 2.0.

37. The memory cell of claim 16 wherein the second material is devoid of silicon nitride.

38. The memory cell of claim 1 wherein the first material consists of or consists essentially of the $SiO_x$, the third material consists of or consists essentially of $SiO_2$, and the second material consists of or consists essentially of the $SiO_y$.

39. The memory cell of claim 38 wherein the first material is directly against the second material and the second material is directly against the third material.

40. The memory cell of claim 39 wherein the first material is directly against the channel material and the third material is directly against the programmable material.

41. The integrated structure of claim 17 comprising a NAND memory array wherein the levels of conductive material comprise wordline levels.

42. The memory cell of claim 20 wherein each of the first, second, and third materials has a thickness no greater than 50 Angstroms.

43. The memory cell of claim 20 wherein the first material is directly against the channel material, the second material is directly against the first material, and the third material is directly against the second material.

44. The memory cell of claim 20 wherein the first material consists of or consists essentially of the $SiO_{x1}N_{y1}$; the second material consists of or consists essentially of the $SiO_{x2}N_{y2}$; and the third material consists of or consists essentially of the $SiO_{x3}N_{y3}$.

45. The memory cell of claim 20 wherein,
   x1 is greater than or equal to 1; and
   y1 is less than or equal to 0.5.

* * * * *